United States Patent

[11] 3,569,848

[72] Inventor Daniel J. Esteban
La Cotiniere, France
[21] Appl. No. 783,235
[22] Filed Dec. 12, 1968
[45] Patented Mar. 9, 1971
[73] Assignee International Business Machines Corporation
Armonk, N.Y.

[54] UNCONDITIONALLY STABLE, OPEN LOOP OPERATIONAL AMPLIFIER

2 Claims, 8 Drawing Figs.

[52] U.S. Cl. 330/14, 330/17, 330/19, 330/30
[51] Int. Cl. H03f 3/18, H03f 3/68
[50] Field of Search 330/17, 19, 30, 30 (D), 14

[56] References Cited

UNITED STATES PATENTS

| | | | |
|---|---|---|---|
| 3,394,316 | 7/1968 | Larson | 330/30(D) |
| 3,401,350 | 9/1968 | Barton et al. | 330/30(D) |
| 3,451,001 | 6/1969 | Foerster | 330/17 |

*Primary Examiner*—John Kominski
*Assistant Examiner*—Siegfried H. Grimm
*Attorneys*—Hanifin and Clark and Kenneth R. Stevens

ABSTRACT: An open loop semiconductor operational amplifier having a differential amplifying input stage, an output stage having high input and low output impedance, and an intermediate stage interconnecting the input and output stage and having low input impedance and high output impedance. The three stages are collectively responsive to an applied input signal so as to maintain unconditional stability up to unity gain operation without external feedback circuitry.

INVENTOR
DANIEL J. ESTEBAN
BY Kenneth P. Stevens
ATTORNEY

UNCONDITIONALLY STABLE, OPEN LOOP OPERATIONAL AMPLIFIER

BACKGROUND OF THE INVENTION

Operational amplifiers are increasingly used in the analogue function processing field. One of the most important drawbacks of the operational amplifier is that it is used as a closed-loop amplifier which may entail an oscillation of the device, which makes it unusable for the conventional functions to which it is intended. Thus, most of the operational amplifiers available at present require rolloff circuits. In addition to the inconvenience which requires a user to include a rolloff circuit for each particular utilization, the initial characteristics are affected. In the case of an integrated device, difficulties are encountered in realizing sufficient valued capacitors and further it is necessary to place the rolloff circuits outside the device, thereby increasing the total bulk or density of the device which offsets one of the fundamental qualities or advantages of an integrated circuit.

SUMMARY OF THE INVENTION

The invention relates to an unconditionally stable, open loop, semiconductor operational amplifier comprising a differential amplifier input stage, a low input and high output impedance intermediate stage, and a high input and low output impedance output stage. The stages comprise semiconductor active element means for providing unconditional stability without the use of an external rolloff circuit.

The amplifier of this invention remedies the above-mentioned drawbacks by providing a stable device for a very large frequency range without requiring rolloff circuits.

Therefore, one object of this invention is a circuit which has the desired operational amplifier characteristics but which has an intrinsic stability, without necessitating a rolloff circuit.

Another object of this invention is an operational amplifier which possesses a very large voltage excursion range that is practically equal to the power supply.

Another object of this invention is to realize an operational amplifier with a controllable and a high maximum slew rate.

Another object of this invention is to achieve a controllable and high-gain operational amplifier.

Still another object of this invention is to provide an operational amplifier which operates within a very high frequency bandwidth which may extend up to the frequency level that causes an open-loop unity gain.

BRIEF DESCRIPTION OF THE DRAWINGS

The invention will be further explained with reference to the accompanying drawings.

DESCRIPTION OF THE PREFERRED EMBODIMENTS

Figure 1:
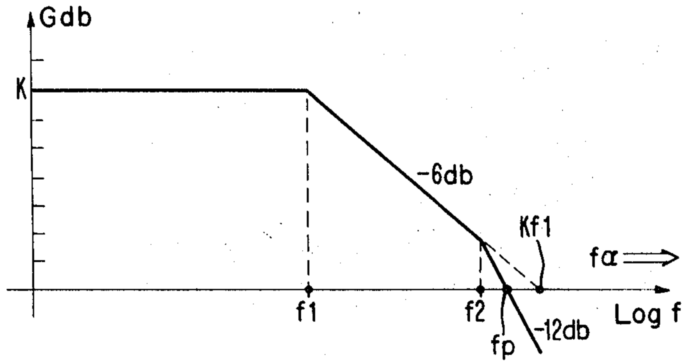
FIG. 1 is the open-loop gain curve of an amplifier.

Generally, an operational amplifier having an inverting input (−) and a noninverting input (+) is intended to receive signals on either of said inputs or on both simultaneously, and also a feedback signal on either inputs, so as to provide the open-loop gain and closed-loop gain of the amplifier. The open-loop gain is generally indicated in decibels, db., by formula 20 log A$v$, where A$v$ is the output voltage-input voltage ratio, and the closed-loop gain approximately is indicated by 20 log $1/\beta$, where $\beta$ is the loop feedback coefficient. The theoretical study relative to the stability of the closed-loop systems shows that if the phase shift between the input and output signals of a closed-loop device is 180°, then the produce is $|\Delta v\beta \gtrsim 1$ and the system oscillates. This explains the reason why the users of amplifiers take all the necessary steps to avoid this condition.

Amplifier stabilization currently is obtained by providing the device with external circuits, the so-called rolloff circuits, the implementation and the utilization of which result immediately from the theoretical data. The gain and phase-shift curves are shown as being asymptotically established when the poles of the equation which governs the gain function are known. Thus, in the high frequency range, and if the system is at a minimum phase one, i.e., if there is no element which introduces a pure delay, the envelope of the high frequency curve can be obtained by a succession of segments which have for extremities the gain function poles and a slope described by the previous slope decreased by 6 db./octave. The phase-shift at this point is almost proportional to the slope. Thus, for a −12 db./octave slope, the phase rotation will asymptotically approach −180°, whereas for a −18 db./octave slope, the 180° phase-shift is obtained at an operating frequency which is within the −12 db./octave region. The high frequency is within the −12 db./octave region. The high frequency bandwidth of the operational amplifier is thus limited by the oscillation risks to a frequency within the 12 db. and 18 db. poles; and the oscillation risks are minimum when the 12 db. pole is near the unity gain axis.

In the servomechanism area it is common to solve this problem in a plain and simple way by adding phase-shift rolloff circuits, e.g., of the RC type, which will bring the first pole position to the low frequencies and force the gain curve to decrease to −6 db./octave from a frequency far lower than the first pole so as to obtain the necessary bandwidth while keeping the assembly stable. Therefore, the use of such a compensating solution requires the calculation of the rolloff circuits parameters for each type of utilization, and the determination of an optimal solution for the different utilizations. Additionally, the open-loop gain of the device is necessarily decreased from the correction pole which is not very desirable for the amplifiers of the type intended to be used as operational amplifiers.

This invention provides an operational amplifier which has an intrinsic stability without necessitating rolloff circuits while maintaining a frequency bandwidth higher than that found in the compensated amplifiers together with a high open-loop gain for a large part of the frequency range. These properties are obtained owing to the use of means which make it possible to obtain a first pole $f1$, FIG. 1, at a relatively high frequency, a second pole $f2$ at a far higher frequency and near the unity axis, and a third pole $f\alpha$ is almost carried to infinity, that is, it appears for a negative gain. Consequently, the closed-loop gain, as it is defined in practice, will be obtained for a bandwidth extending up to a frequency $fp$, without requiring rolloff circuits.

Figure 2:
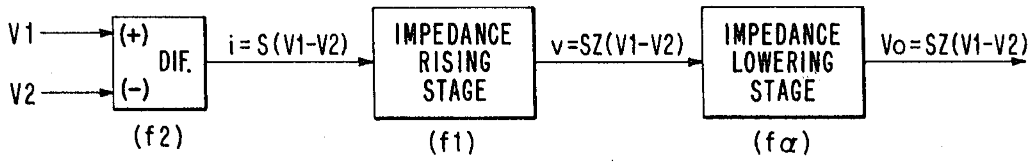
FIG. 2 is the block diagram of the device according to this invention.

The above-mentioned properties are obtained in this invention by using three stages, one differential stage and two impedance transforming stages as shown in FIG. 2. The first stage is a differential stage of transductance $S$ which respectively receives signals $V1$ and $V2$ at the noninverting and inverting inputs and which supplies a current $i=S(V1-V2)$ and drives the second stage which has a low input impedance and a high output impedance $Z$, so that the output voltage at this second stage is $V=SZ(V1-V2)$. The latter or second stage drives a third input impedance stage having a low output impedance so that the output is essentially $V\ o=SZ(V1-V2)$. Besides, the choice of the different circuit elements will be such that the first stage supplies a pole at the frequency $f2$, the second stage supplies a pole at a lower frequency $f1$, an intermediate value in the frequency spectrum, so that the frequency $f1$ still will be relatively high. The third stage will supply a pole at frequency $f\alpha$ far higher than $f1$ and $f2$ and which is within the negative gain range.

Figure 3:
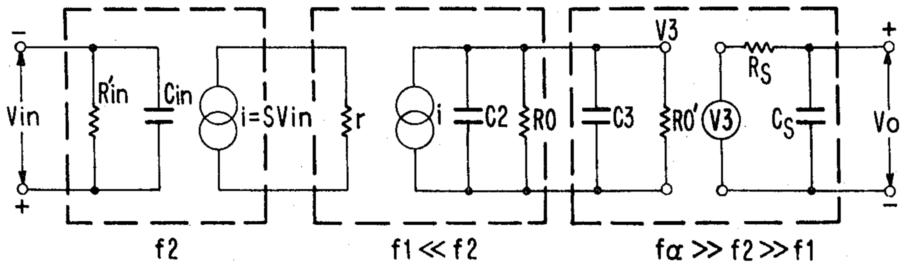
FIG. 3 is an equivalent schematic diagram of an embodiment of the invention.

The equivalent schematic diagram of a device which has the above-mentioned properties is approximately depicted in FIG. 3. The differential stage comprises an input resistor R'*in* and an input capacitor C*in* in parallel, and an output current source *i* −*SVin*. The present techniques relating to differential amplifiers having improved characteristics as to the input offset voltage and the common mode rejection, for instance, make it possible to obtain devices with an equivalent schematic diagram of the required type. Some embodiments for the stages of the device according to the invention wild be described further on and will make it possible to obtain the desired properties illustrated in the attached equivalent schematic drawing.

The second stage of the impedance rising type has a very low input impedance *r*, which substantially short circuits the first stage output, and a high output impedance comprising resistor RO and capacitor C2 in parallel. The transfer current between both input and output is made without modification and the active circuit elements are in the form of a current generator *i* =*SVin* which feeds the output impedance. This second stage drives an impedance lowering stage of which the equivalent input circuit is formed of a resistor RO' in parallel with capacitor C3, and its equivalent output circuit includes a voltage source *V*3 equal to the voltage which appears at the RO' terminals, and is applied to the circuit including a resistor $R_s$ and a capacitor $C_s$ in series therewith. The output voltage *V*0 is taken across $C_s$ terminals.

Each of the three stages makes it possible to obtain the desired poles for the open-loop amplifier. The theoretical study made with reference to FIG. 3 is used to define three poles $f1$, $f2$ and $f\alpha$ respectively and is given by:

$$fl=\frac{1}{2\pi}\,\frac{1}{(C2+C3)\left(\dfrac{RoR'o}{Ro+R'o}\right)}=\frac{1}{2\pi}\,\frac{1}{C_LR_L}\quad\text{where}$$

$$C_L=C2+C3$$

$$R_L=\frac{RoR'o}{Ro+R'o}$$

$$f2=\frac{1}{2\pi}\,\frac{1}{\text{Rin Cin}}\quad\text{where Rin includes also the impedance loading the input inpedance R'in}$$

$$f\alpha=\frac{1}{2\pi}\,\frac{1}{C_sR_s}$$

Therefore, it can be seen that by selecting elements such that $f2$ is higher than $f1$, and tha$f\alpha$ approaches infinity, the 12 db. pole is at a high frequency with respect to the 6 db. pole and thus it is near the unity gain axis. Additionally, the intermediate stage determines the 6 db. pole and it is possible to bring this pole to a relatively high frequency.

The equivalent diagram of FIG. 3 is used to calculate the voltage gain of the amplifier. The following formula is easily obtained:

$$V_o=-SR_L\frac{1}{1+JR_SC_S\omega}\times\frac{1}{1+JR_LC_L\omega}\,\text{Vin},\qquad(1)$$

Figure 4:
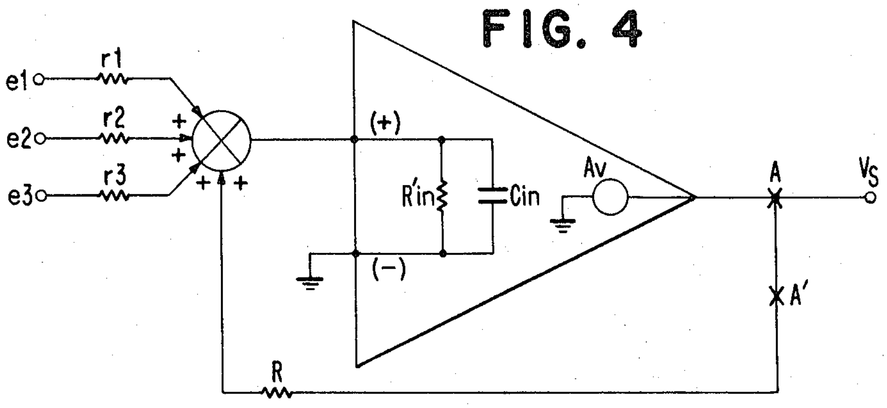
FIG. 4 is a utilization mode of the amplifier according to the invention.

The operational amplifier is intended to receive at its input several voltage supplying sources *e*1, *e*2, *e*3 each having internal impedances *r*1, *r*2, *r*3, respectively, and a feedback loop R, as shown in FIG. 4. Therefore, it can be understood that these internal impedances which load the amplifier will modify the R'*in* value by shunting it, and therefore will act upon the 12 db. position and the phase margin so as to ensure stability. In any event, the R'*in* control possibilities ensure a 12 db. positioning, $f2$, so as to maintain, (even in the most unfavorable cases of utilization), a phase margin adequate to ensure stability.

Figure 5:
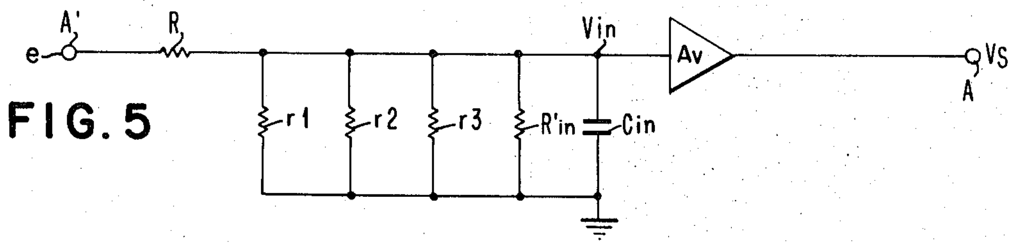
FIG. 5 is an equivalent schematic diagram of the device shown in FIG. 4.

These considerations are shown with reference to FIGS. 4 and 5. By replacing $j\omega$ by $p$ in equation (1), the A*v* gain of the amplifier can be obtained from equation (1) as:

$$Av=\frac{V_o}{\text{Vin}}=-SR_L\frac{1}{1+R_SC_Sp}\times\frac{1}{1+R_LC_Lp}\qquad(2)$$

The output stage is chosen so that $f\alpha$ is carried towards infinity. Therefore its influence on the phase margin, and consequently the stability is negligible and thus the gain A*v* can be considered to be approximately equal to:

$$Av=-SR_L\frac{1}{1+R_LC_Lp}\qquad(3)$$

As shown in FIG. 4, sources *e*1, *e*2 and *e*3 drive a summing stage connected to a noninverting input (+) of the amplifier, and the inverting input (−) is connected to ground. The amplifier behaves as a A*v* gain stage wherein R'*in* and C*in* are in parallel between the inputs, (−) and (+), of the amplifier. A feedback loop R connects output $V_S$ to the summing stage at the device input. The open-loop gain of the device is obtained by taking into account not only the qualities inherent to the amplifier but also the actual utilization mode, and is calculated with reference to the diagram shown in FIG. 5, by taking into account that *e*1=*e*2=*e*3=that the previous loop has been broken at points A A', and that a source *e* is applied to A'. It should be noted that the same holds true for any *n* number of sources and the illustrative example has been limited to three only for simplicity of understanding. The diagram shown in FIG. 5, therefore, includes an A*v* gain amplifier which has only one 6 db. pole, as shown by equation (3), which is unconditionally stable, and which receives at the input a voltage *e* applied to A', through a resistor R. The input circuit is shunted to ground by *r*1, *r*2, *r*3, R'*in* and C*in* in parallel. A circuit equivalent to that shown in FIG. 4 is obtained and the new voltage V*in* at point B is represented by:

$$\text{Vin}=\beta o\frac{e}{1+\beta oR\ \text{Cin}\ p}$$

$$\text{where}\ \beta o=\frac{\text{Rin}}{R+\text{Rin}}$$

and R*in* is equivalent to *r*1, *r*2, *r*3 and R'*in* in parallel.

The gain of the network between A' and the amplifier input is:

$$\beta=\frac{\beta o}{1+\beta oR\ \text{Cin}\ p}$$

Thus, the open-loop assembly will have a gain:

$$G=Av\times\frac{\beta o}{1+\beta oR\ \text{Cin}\ p}=Av\times\beta$$

which makes appear the second pole of function G, $$G=-\beta oSR_L\frac{1}{1+R_LC_Lp}\times\frac{1}{1+\beta oR\ \text{Cin}\ p}$$

and thus, $$\beta o\,S\,R_L=K,\ R_L\,C_L=T1\ \text{and}\ \beta o\,R\,Cin=T2$$

$$G_{(p)}=\frac{-K}{(1+T1p)(1+T2p)}\qquad(4)$$

It may be supposed that the circuit is a closed-loop circuit if points A and A' are connected anew, thus creating a total feedback, where, $G_{(p)}=1$ since $V_S=0$. The closed-loop transfer function, therefore, is:

$$W(p)=\frac{-G_{(p)}}{1-G_{(p)}}=\frac{-1}{1-\dfrac{1}{G_{(p)}}}\qquad(5)$$

Taking equation (4) into account, function (5) becomes:

$$W_{(p)}=-\frac{1}{1+\dfrac{1}{K}+\left(\dfrac{T1+T2}{K}\right)p+\dfrac{T1\ \ T2}{K}p^2}.\qquad(6)$$

Coefficient $K=\beta o\,S\,R_L$ and can be controlled in order to be far higher than unity so that equation (6) can be written as:

$$W_{(p)} = \frac{-1}{1+\left(\frac{T1+T2}{K}\right)p+\left(\frac{T1 \square T2}{K}\right)p^2}$$

Replacing $p$ by $j\omega$, there is obtained:

$$W_{(j\omega)} = \frac{-1}{\left[1-\frac{T1\ \ T2}{K}\omega^2\right]+j\left(\frac{T1+T2}{K}\right)\omega}$$

which further can be written as:

$$W_{(j\omega)} = \frac{-1}{\left[1-\frac{(\omega)^2}{\omega p}\right]+jx2\zeta x\frac{\omega}{\omega p}}$$

The self-oscillation frequency of the system is:

$$\omega p=\sqrt{\frac{K}{T1\ \ T2}}=\sqrt{\frac{S}{RC_L\ \mathrm{Cin}}}$$

The damping factor is equal to:

$$\zeta=\frac{1}{2}\,\frac{T1+T2}{K}\times\omega p=\frac{1}{2}\,\frac{\sqrt{\frac{T1}{T2}}+\sqrt{\frac{T1}{T2}}}{\sqrt{K}}$$

Considering the practical case where $Rin\ Cin << R_L\ C_L$, then:

$$\zeta=\frac{1}{2}\times\sqrt{\frac{C_L}{S\ \mathrm{Rin\ Cin}}}\left[\sqrt{\frac{R}{\mathrm{Rin}}}+\sqrt{\frac{\mathrm{Rin}}{R}}\right] \quad (7)$$

Since the bracketed term is minimum for $R=Rin$, the minimum damping factor is:

$$\zeta\ \mathrm{min}=\sqrt{\frac{C_L}{S\ \mathrm{Rin\ Cin}}} \quad (8)$$

and thus, equation (7) is written:

$$\zeta=\frac{\zeta\ \mathrm{min}}{2}\left[\sqrt{\frac{R}{\mathrm{Rin}}}+\sqrt{\frac{\mathrm{Rin}}{R}}\right] \quad (9)$$

The phase margin is obtained for the absolute magnitude of $G_{(j\omega)}$ which is equal to unity: and it represents the phase angle value for which $G_{(j\omega)}=1$ in the Nyquist plot. Then, $G_{(j\omega)}$ $\zeta^2$ is equal to 1, and $\omega 1$ for $K>>1$, is equal to:

$$\omega 1=\omega p[\sqrt{1+4\zeta^2}-2\zeta^2]^{1/2}=\frac{p}{[\sqrt{1+4\zeta^4}+2\zeta^2]^{1/2}}$$

The phase margin $\Phi$ is given by the relation:

$$\mathrm{Sin}\ \phi=2\zeta\frac{\omega 1}{\omega p}=\frac{2\zeta}{[\sqrt{1+4^4}+2^2]^{1/2}}$$

For the low values of $\zeta$ : $\Phi=2\zeta$, and when $\zeta$ is increasing then $\Phi$ tends toward 90°.

A good approximation for higher values of $\zeta$, more than 10 percent, $0<\zeta<0,5$, then $\Phi$ is given by:

$$\phi_{\mathrm{degree}}=110°\times\zeta=55°\times\zeta_{\mathrm{min}}x\left[\sqrt{\frac{R}{\mathrm{Rin}}}+\sqrt{\frac{\mathrm{Rin}}{R}}\right]$$

Equation (8) shows that the minimum phase margin is never equal to zero, which makes the system unconditionally stable. Additionally, the manufacturer can control minimum phase margin in the worst case so that the sources connected by the user will have infinite internal impedances, and $Rin=R'$ The $Q$ factor is fixed by the input circuit, the slope, and capacitor $C_L$ whereby:

$$Q=20\ Lof\frac{1}{2\zeta}$$

The parameters introduced in this coefficient may be chosen so as to define Q max.

In brief, it appears that the open-loop gain considering the worst conditions of utilization has two poles and that the 12 db. one can be localized in the vicinity of the intersection point of the slope at −6 db. with the unity gain axis, whereas the 18 db. pole is carried to infinity, which insures an intrinsic stability to the system. This may be intuitively understood by noting that the above-summarized conditions includes a phase rotation which goes over 90° very slightly within the whole frequency range up to the unity gain. Thus, the amplifier is unconditionally stable without requiring any external rolloff circuit. The choice of the different elements and of the structure in conformity with this invention makes it possible to obtain an important distance between the 6 db. and 12 db. poles on the one hand, and a carry of the 18 db. pole practically to infinity, while positioning it within the gain range lower than unity, which makes its influence practically negligible.

Further features and advantages will be disclosed from the detailed description of the embodiments of the device according to the invention.

Figure 6:
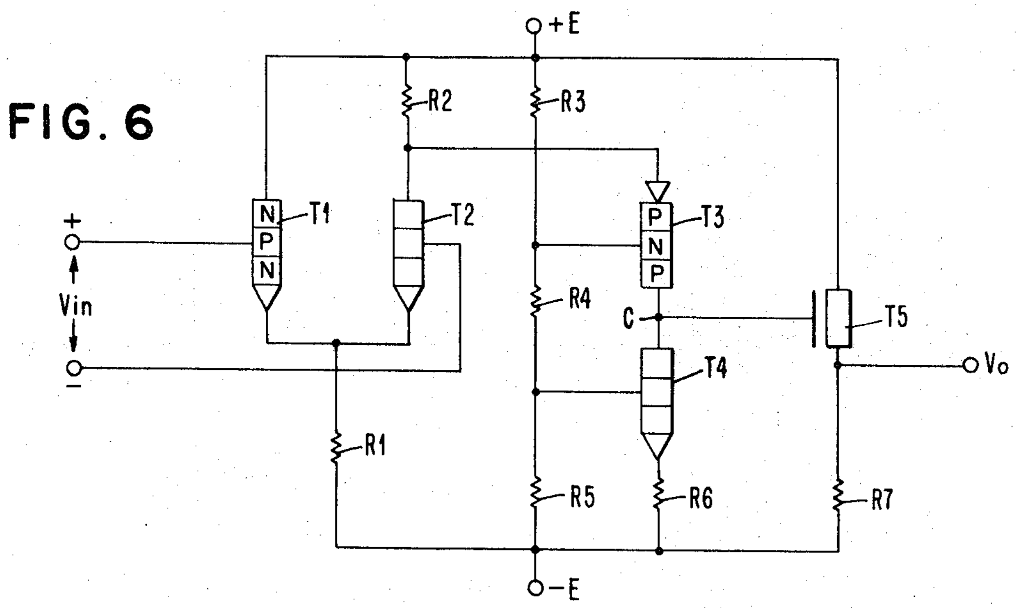
FIG. 6 is an embodiment of this invention.

FIG. 6 shows a very simple embodiment in conformity with the general characteristics set forth above. The differential amplifier, or first stage, includes transistors T1 and T2 which have their emitters connected in common to the negative terminal of a power supply E through a resistor R1, while their collectors are respectively connected to the positive terminal of the source E, a direct connection for T1 and through resistor R2 for T2. Input V*in* is fed between T1 and T2. The second stage includes transistor T3 of the PNP type and transistor T4 of the NPN type. They are biased by a voltage divider R3, R4, and R5 connected between the terminals of source E. Resistor R4 is connected between the bases of transistor T3 and T4. The input to the stage is realized by connecting the collector of T2 to the emitter of T3 so that the output appears at point C which is common to both collector terminals of T3 and T4. The third stage is implemented by a field effect transistor which has its gate connected to the output of the previous stage, its anode (drain) connected to the positive terminal of source E, and its cathode (source) connected to the negative terminal of said source E through resistor R7. The transfer characteristics of the second and third stages are obtained in a very simple way because T3 is operating in a grounded base condition. As a result, a low impedance is presented at the collector of T2 which is practically a direct connection to ground. The second transistor T4 also operates in grounded base condition and the output impedance at this second stage is equal to that of the collector outputs of transistors T3 and T4 connected in parallel, but yet remains very high in comparison with the input impedance of the stage. Since the third stage input is applied to a T5 gate, it represents a high impedance whereas the output at the cathode is at low impedance. The impedance involved at both second and third stages causes all the current $i=SVin$ to flow through the second stage. Since T3 is a grounded base, output point C can practically be at the base DC potential. The voltage swing at the output point C of the second stage is determined by bridge resistors R3, R4, R5 and is:

$$2E\left[1-\frac{R3+R5}{R3+R4+R5}\right]$$

and it can be made very close to 2E, i.e., it has the power supply source value. The output stage makes it possible to obtain a low output impedance.

The resulting device makes it possible to obtain desirable performances, such as, low offset voltage, high input impedance (within 10 and 100 Ω) and high gain (in the order of 80 to 90 decibels).

Figure 7:
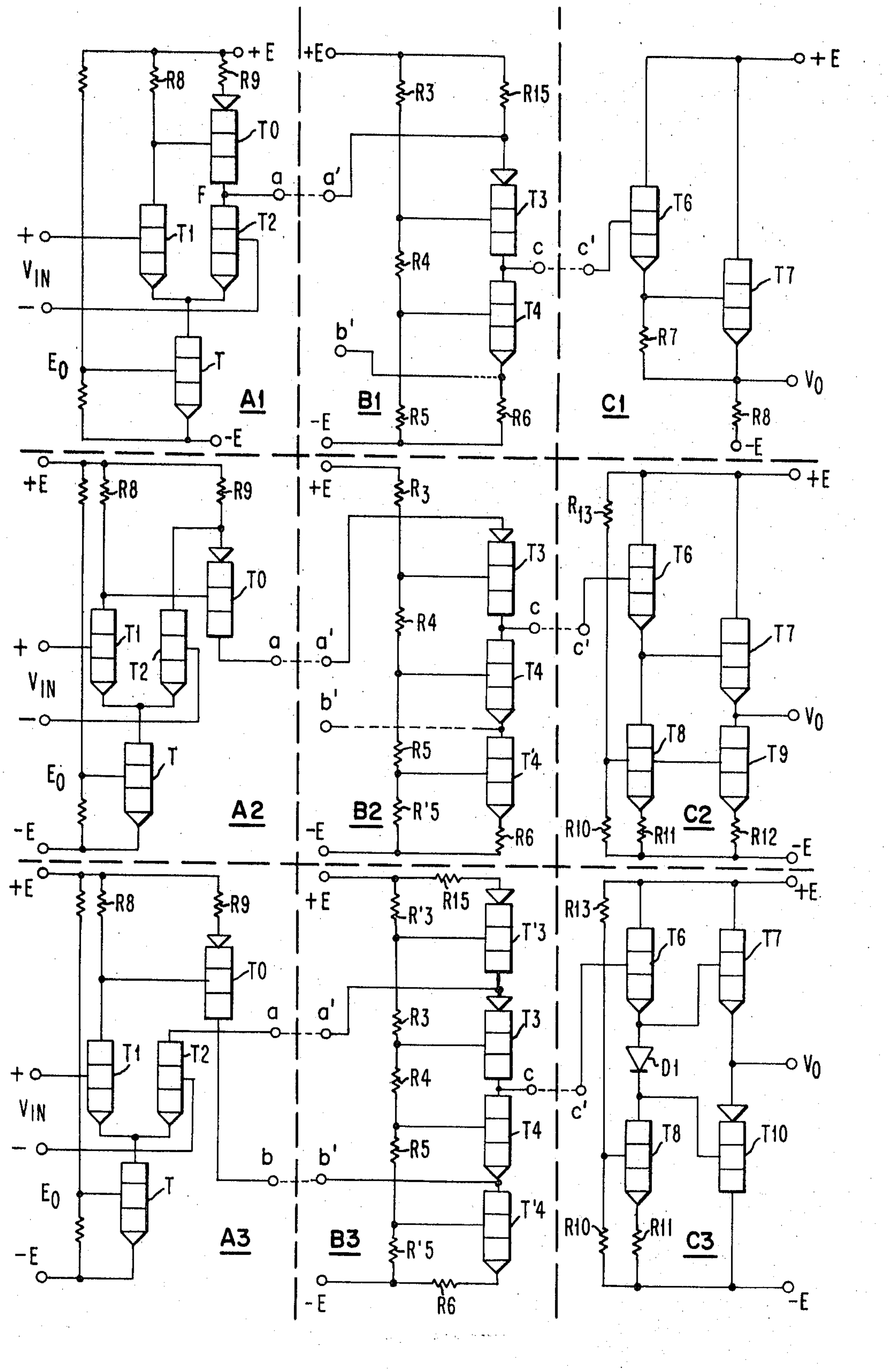
FIG. 7 is several embodiments of the different stages of the operational amplifier according to the invention.

Some other more elaborate embodiments are shown in FIG. 7 and include three columns; column A which indicates three versions of the first differential amplifier stage; column B which indicates three versions of the impedance rising stages (low Z*in*-high Z*out*); and third column C which indicates three versions of the impedance lowering stages (high Z*in*-low Z*out*).

The different stages in a same line sequentially connected form an operational amplifier of the type which is the object of this invention, but, in addition, it should be noted that many combinations can be made in exchanging some stages. However, for simplicity of description, the only described combinations will deal with series connections (A1, B1, C1), (A2, B2, C2) and (A3, B3, C3).

All the differential input stages include transistors T1, T2, a constant current generator T, and a current inverter TO; the only differences which exist between the stages relate to the method of connecting the current inverter and the positions of the outputs of the stage. Thus, circuit (A1) includes a differential stage with transistors T1 and T2 fed through their bases. Their emitters are commonly connected at the collector of transistor T. Transistor T serves as a constant current generator and has its emitter connected to the negative terminal of a power supply E while its base is polarized or biased at a fixed potential E*o* by a resistive voltage divider. The collector of transistor T1 is connected to the positive terminal of E through a resistor R8. The collector of transistor T2 is connected to output point F which is itself connected to the transistor T*o* collector terminal. The transistor T*o* is in series with resistor R9 which also is connected to the positive terminal of E. The base of transistor T*o* is directly connected to the T1 collector. Transistor T*o* is chosen so that it functions as a current inverter with respect to T1, and thus, it improves the common mode rejection. The differential output $i$=SV*in* is taken at point F.

Circuit (A2) is different from the previous one only in that T*o* is no longer in series with the collector of T2, but has its emitter connected to the T2 collector terminal, and its base connected to T1 collector. The stage output is taken from the T*o* collector. Stage (A3) is different from (A2) only in that the T2 collector is no longer connected to the T*o* emitter, but constitutes a second output point. Symmetrical outputs *a* and *b* are thus obtained, with attendant advantages to be discussed below.

The second column circuits all act as impedance rising stages, as previously mentioned. At (B1) there is shown a stage identical with its counterpart shown in FIG. 6, and therefore, it necessitates no detailed description since like elements are given the same reference numbers. Only one additional resistor (FIG. 7, Stage B1) R15 has been introduced between the T3 emitter and terminal +E. The input-output impedance ratio of the stage B2 is improved by providing a second transistor T'4, of the same type as T4 and it is connected in series between the T4 emitter and resistor R6. An additional resistor R'5 obviously is necessary in the voltage divider R3, R4, R5 for biasing the transistor bases. Resistor R'5 is placed in series between the R5 terminal and the terminal −E. Resistor R15 is removed in this embodiment of stage (B2).

Stage (B3) is different from (B2) by the addition of a transistor T'3, of the same type as T3, and by the addition of a resistor R'3 connected between resistor R3 and terminal +E. In this embodiment resistor R15 is reinserted. As mentioned above, multiple combinations can be provided by replacing a stage type (B) by another one, and explains why (B1) and (B2) are provided with a second input, indicated by a dotted line applied to the T4 emitter, for a symmetrical driving operation.

The third stages, type (C) must have a high input impedance and a low output impedance. This circuit can be simply of the Darlington type, e.g. (C1), and includes two transistors T5 and T7 which have their collectors respectively connected to terminal +E. The input is applied to the T6 base, and the output appears on the T7 emitter. A resistor R7 connects the T6 emitter to the output terminal V*o*. A resistor R8 is placed between the output terminal V*o* and the −E terminal. Some other output stages can be derived from the previous one so as to form composite Darlington stages. For instance, at (C2), the transistor T6 emitter is connected to the transistor T8 collector. The emitter of transistor T8 is connected to −E through a resistor R11. The T7 emitter is connected to the output V*o* and to the T9 collector. The emitter of T9 is connected to −E through a resistor R12. The bases of T8 and T9 are biased by a voltage divider including R3 and R10 placed between the +E and −terminals.

Circuit (C3) is similar to the previous one but there is additionally a diode D1 between transistors T6 and T8. Also, transistor T10 is of an opposite type (PNP) to those transistors previously described. The base of transistor T10 is driven from the T8 collector.

It is obvious for those skilled in the art that the operation of these devices is fundamentally the same as that of the circuit shown in FIG. 6 and merely involves circuit variations in conformity with the principles of the present invention. The use of any of these output circuits per se present only small advantages.

Figure 8:
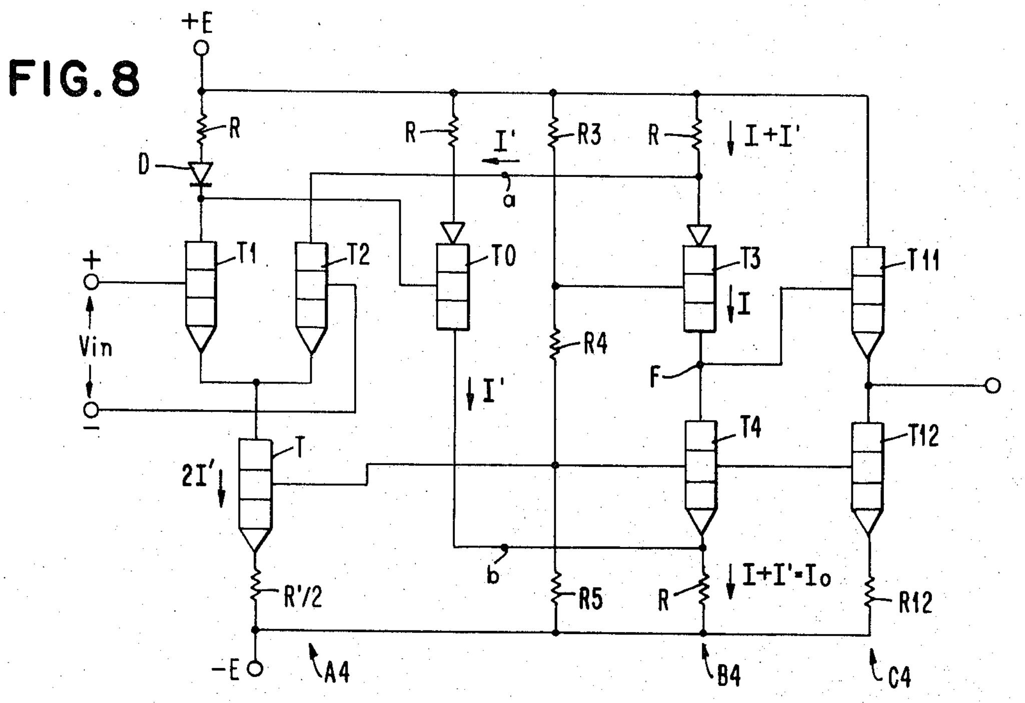
FIG. 8 describes the operation of one of the devices shown in FIG. 7.

However, the combination of the first two stages may be selected judiciously so as to provide some additional advantages. Thus, theory indicates that circuit (A2) may show instability risks because an additional pole may appear because of stage T*o* so as to require that a capacitor be connected to the terminals of R8 in order to compensate for this potential detrimental effect. The drawbacks do not appear when using the circuit (A1). Additionally, (A2) is of particular interest because when it is used with the (A3) version it will have additional advantages which will be described with reference to FIG. 8.

This FIG. is a simplified embodiment of circuit (A3, B3, C3) in order to make the drawing clearer. Stage (A4) is identical with (A3) and R8, R9 and R are chosen to be of equal value. Resistor R'/2 is placed between the transistor T emitter and terminal −E. Diode D provides the compensation for the emitter-base diode of transistor T*o*. Stage (B4) is identical with (B1) and is symmetrically driven and in this embodiment R15=R6=R. The output stage is simply formed of two transistors T11 and T12 and the T11 collector is connected to terminal +E, and its emitter is connected to the output terminal and to the collector of T12. The emitter of transistor T12 is connected to terminal −E through resistor R12. The transistor T11 base is connected to the output of the previous stage and the T12 base terminal is maintained at the same reference potential as T and T4 at point F, due to the voltage divider effect of R3, R4, R5. Transistors T and T4 act as constant current generators to supply currents 2I' and I, respectively. Since the input impedance of stage (B4) is low during dynamic operation, a virtual short circuit exists between points *a* and *b* so as to make stage (A4) equivalent to (A1), and thus above-mentioned advantages are realized in addition to those described with respect to circuit (A2). This circuit maintains the advantages due to symmetry, more particularly, the maximum slewing rate is identical for the leading and trailing edges of the signals since it depends only on the junction capacitances of T3, T4 and T11 at output point F. This coefficient can be defined by the maximum charging rate of the junction capacitances under the action of current 2I'. Since the capacitances are fixed by the type of transistors employed, the maximum slewing rate is controlled by controlling I', which can be obtained simply by controlling the R' resistor value.

A gain control, as shown by equation (3), is possible by varying R', which acts upon the differential slope, and by varying R, which acts upon the impedance seen at point F.

It is clear that the preceding description has only been given as an unrestrictive example, and that numerous alternatives may be considered without departing from the spirit and scope of the invention.

I claim:

1. An open-loop operational amplifier for amplifying an applied input signal, adaptable for circuit integration, and having unconditional stability of operation without external feedback circuitry means comprising:

a. a pair of input terminals for receiving an input signal;

b. a differential amplifier input stage including first and second transistors, each base terminal of the first and second transistors being connected to a respective one of the pair of input terminals;

c. a first source of constant current, each emitter of the first and second transistors being connected in common and to the first source of constant current;

d. a second stage comprising a grounded base transistor amplifier means having first, second, and third terminals, and an output node connected to the second terminal, the first terminal being adapted to receive an input signal from the collector of the second transistor, the second terminal being connected to a second source of constant current, and the third terminal being connected to a first biasing network for providing a grounded base mode of operation;

e. the collector of the first transistor being connected to a second biasing network for providing collector current thereto, f. an emitter follower output stage, the emitter follower output stage being adapted to receive an input signal from the output node of the grounded base transistor amplifier means so as to provide an output voltage from the open-loop operational amplifier; and g. a temperature compensated constant current source for stabilizing the output voltage generated at the output node of the grounded base transistor amplifier means, the temperature compensated constant current source being connected between collector terminal of the first transistor and the second constant current source and being responsive to a change in the collector current to the first transistor for supplying a current to the second constant current source so as to offset the change in collector current to the second transistor in order to prevent the change in collector current to the second transistor from varying the DC output voltage at the output node of the grounded base transistor amplifier means due to ambient temperature changes and to DC voltage fluctuations at the first and second biasing networks.

2. An open-loop operational amplifier for amplifying an applied input signal, adaptable for circuit integration, and having unconditional stability of operation without external feedback circuitry means as in claim 1 wherein:

a. the temperature compensated constant current source includes a third transistor connected to a third biasing network; and b. a semiconductor element connected to the collector of the first transistor and to the temperature compensated constant current source, the semiconductor element being responsive to the collector current of the first transistor for offsetting the base-emitter voltage change of the third transistor due to ambient temperature changes.